(12) United States Patent
Scheer et al.

(10) Patent No.: US 7,977,255 B1
(45) Date of Patent: Jul. 12, 2011

(54) METHOD AND SYSTEM FOR DEPOSITING A THIN-FILM TRANSISTOR

(75) Inventors: Evelyn Scheer, Stockstadt (DE); Oliver Graw, Alzenau (DE); Roland Weber, Kahl am Main (DE); Udo Schreiber, Jossgrund (DE)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 12/884,043

(22) Filed: Sep. 16, 2010

(30) Foreign Application Priority Data

Sep. 10, 2010 (EP) .................................... 10176247

(51) Int. Cl.
*H01L 21/31* (2006.01)
*H01L 21/469* (2006.01)
*C23C 14/00* (2006.01)

(52) U.S. Cl. ................. 438/776; 204/192.23; 118/723 I

(58) Field of Classification Search .................. 438/776, 438/787, 791; 204/192.23; 118/723 I
See application file for complete search history.

(56) References Cited

U.S. PATENT DOCUMENTS

| | | | |
|---|---|---|---|
| 5,576,231 A | 11/1996 | Konuma et al. | |
| 5,622,607 A | 4/1997 | Yamazaki et al. | |
| 5,817,549 A | 10/1998 | Yamazaki et al. | |
| 5,968,328 A | 10/1999 | Teschner et al. | |
| 6,362,097 B1 | 3/2002 | Demaray et al. | |
| 6,572,940 B1 | 6/2003 | Noethe et al. | |
| 2002/0024048 A1 | 2/2002 | Ohtani | |
| 2002/0160554 A1 | 10/2002 | Isobe et al. | |
| 2004/0031961 A1 | 2/2004 | Zhang et al. | |
| 2004/0241920 A1 * | 12/2004 | Hsiao et al. | 438/158 |
| 2005/0040034 A1 * | 2/2005 | Landgraf et al. | 204/192.38 |
| 2005/0122351 A1 | 6/2005 | Yamazaki et al. | |
| 2007/0051952 A1 | 3/2007 | Yamazaki et al. | |
| 2009/0218213 A1 * | 9/2009 | Trassl et al. | 204/192.1 |
| 2009/0277778 A1 * | 11/2009 | Stowell et al. | 204/192.12 |
| 2010/0236920 A1 * | 9/2010 | Mueller et al. | 204/192.13 |

FOREIGN PATENT DOCUMENTS

CN 2516564 Y 10/2002

OTHER PUBLICATIONS

N. Danson, et al., "Improved control techniques for the reactive magnetron sputtering of silicon to produce silicon oxide and the implications for selected film properties," Thin Film Solids 289, 1996, pp. 99-106, Elsevier, UK.
EP Search Report, EP 10 17 6247 dated Jan. 17, 2011.

* cited by examiner

*Primary Examiner* — W. David Coleman
(74) *Attorney, Agent, or Firm* — Patterson & Sheridan, LLP.

(57) ABSTRACT

A method for forming a thin-film transistor gate insulating layer over a substrate disposed in a processing chamber is provided. The method includes: introducing a processing gas for producing a plasma in the processing chamber; heating the substrate to a substrate processing temperature of between 50 and 350° C.; and depositing silicon oxide, silicon oxynitride, or silicon nitride over the heated substrate by sputtering a target assembly at a medium frequency.

20 Claims, 4 Drawing Sheets

US 7,977,255 B1

METHOD AND SYSTEM FOR DEPOSITING A THIN-FILM TRANSISTOR

TECHNICAL FIELD

Embodiments of the present disclosure relate to methods and systems for deposition of a thin-film transistor (TFT). In particular, embodiments of the present disclosure relate to methods and systems for deposition of a gate insulating layer of a TFT.

BACKGROUND ART

TFTs are a particular class of field effect transistors made of thin films. These thin films form a semiconductor layer (such as an active layer of the TFT constituting the channel), dielectric layers (such as a gate insulating layer, an etch stop layer, or a passivation layer) and metallic contacts (such as a gate, a drain, or a source of the TFT). These thin films are formed over a supporting substrate, for example, glass. At least some known TFTs are implemented in liquid crystal active matrix displays (LCDs), which are widely employed for computers and television monitors. Furthermore, at least some known TFTs are implemented in organic light emitting diodes (OLEDs) which are also used for active matrix displays.

Generally, TFTs include a gate insulating layer for insulating the gate terminal. In particular, at least some known TFTs are provided with a gate insulating layer formed from silicon oxide (e.g., $SiO_2$). The gate insulating layer is a key factor in the performance of TFTs. In particular, the gate insulating layer greatly influences the breakdown voltage and the leakage current of the TFT.

Accordingly, it is desirable to provide a deposition method and a deposition system for forming a gate insulating layer, which facilitates improving the performance of a TFT.

SUMMARY OF THE INVENTION

In one aspect, a method for forming a thin-film transistor gate insulating layer over a substrate disposed in a processing chamber is provided. The method includes introducing a processing gas for producing a plasma in the processing chamber, heating the substrate to a substrate processing temperature of between 50 and 350° C., and depositing silicon oxide (e.g., SiO or $SiO_y$, such as $SiO_2$), silicon oxynitride (e.g., SiON), or silicon nitride (e.g., SiN) over the heated substrate by sputtering a target assembly at a medium frequency.

In another aspect, a deposition system for forming at least a portion of a thin-film transistor over a substrate is provided. The deposition system includes: a processing chamber adapted to contain a processing gas for producing a plasma in the processing chamber, a heating system being configured for heating the substrate to a substrate processing temperature of between 50 and 350° C., and a sputtering system configured for depositing silicon oxide (e.g., SiO or $SiO_y$, such as $SiO_2$), silicon oxynitride (e.g., SiON), or silicon nitride (e.g., SiN) over the heated substrate by sputtering a target assembly at a medium frequency in a manner such that a gate insulating layer is formed over the substrate.

In yet another aspect, a control assembly for use with a deposition system is provided. The deposition system is configured to form at least a portion of a thin-film transistor onto a transistor substrate and includes a heating system for heating the transistor substrate and a sputtering system for depositing silicon oxide (e.g., SiO or $SiO_y$, such as $SiO_2$), silicon oxynitride (e.g., SiON), or silicon nitride (e.g., SiN) by sputtering a target assembly at a sputtering frequency. The control assembly includes: a heating control module configured to operate the heating system for adjusting the temperature of the transistor substrate to a substrate processing temperature; and a sputtering control module configured to operate the sputtering system for forming a gate insulating layer of the thin-film transistor by sputtering said target assembly at a sputtering frequency in the medium frequency range when the substrate processing temperature is approximately between 50 and 350° C.

In a further aspect, a thin-film transistor is provided. The thin-film transistor includes a gate insulating layer including silicon oxide, silicon oxynitride, or silicon nitride deposited over a substrate at a substrate processing temperature of between 50 and 350° by sputtering a target assembly at a medium frequency.

Surprisingly, the combination of substrate heating and sputtering at medium frequencies according to the above method, system, and assembly facilitates providing a gate insulating layer with a particularly high film quality. Such a particularly high film quality facilitates improving the performance of a TFT. In particular, the embodiments described herein achieve a film quality that facilitates fabrication of a TFT having a high breakdown voltage and a low leakage current in comparison to at least some known TFTs.

Further aspects, advantages, and features of the present invention are apparent from the dependent claims, the description, and the accompanying drawings.

Embodiments are also directed to apparatuses for carrying out the disclosed methods and including apparatus parts for performing described method steps. Furthermore, embodiments are also directed to methods by which the described apparatus operates or by which the described apparatus is manufactured. They may include method steps for carrying out functions of the apparatus or manufacturing parts of the apparatus. The method steps may be performed by way of hardware components, firmware, software, a computer programmed by appropriate software, by any combination thereof or in any other manner.

BRIEF DESCRIPTION OF THE DRAWINGS

A full and enabling disclosure, including the best mode thereof, to one of ordinary skill in the art, is set forth more particularly in the remainder of the specification, including reference to the accompanying figures, wherein.

DETAILED DESCRIPTION OF THE INVENTION

Figure 1:
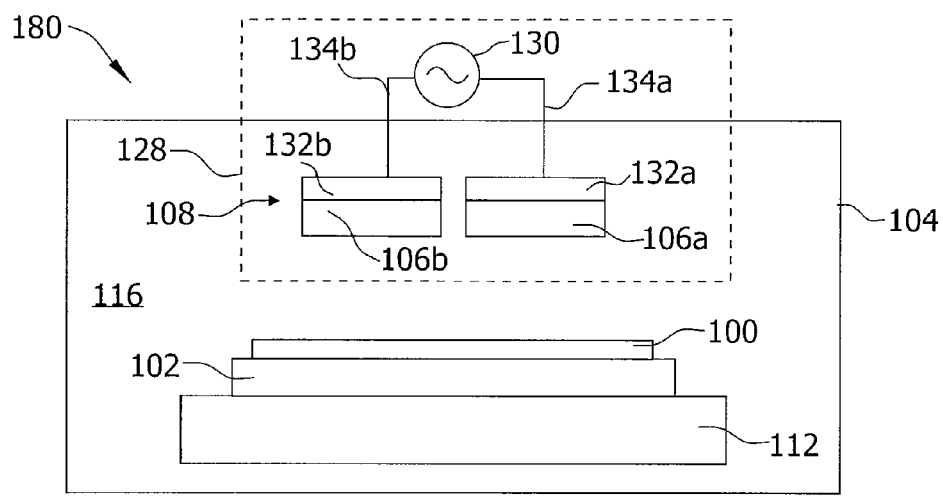
FIG. 1 is a schematic representation of an exemplary deposition system.

Reference will now be made in detail to the various embodiments, one or more examples of which are illustrated in the figures. Each example is provided by way of explanation and is not meant as a limitation of the invention. It is contemplated that elements of one embodiment may be advantageously utilized in other embodiments without further recitation.

The embodiments described herein include a method for forming a TFT gate insulating layer in which: a substrate is heated to a substrate processing temperature of between 50 and 350° C.; and a gate insulating material, such as silicon oxide, silicon oxynitride, or silicon nitride, is deposited over the heated substrate by sputtering a target assembly at a medium frequency. According to typical embodiments, the target assembly includes a double cathode. In particular, the target assembly may include at least two target sub-assemblies, each of them including a cathode operatively coupled to a target element for sputtering of target material.

According to typical embodiments, the deposition of the gate insulating material is performed when the substrate is at a temperature of between 50 and 350° C. According to typical embodiments, middle or medium frequency sputtering having frequencies in the range of 1 kHz to 100 kHz, for example, 20 kHz to 50 kHz, can be provided for the deposition of the gate insulating material.

According to typical embodiments of the present disclosure, medium frequency sputtering is realized by coupling, during sputtering, a medium frequency AC power to a plasma in a processing chamber through an electrode system. The electrode system is typically formed by at least two sputtering cathodes. In particular, according to certain embodiments, deposition of the gate insulating material includes medium frequency (MF) sputtering from a double cathode. As used herein, MF sputtering from a double cathode refers to sputtering from a target assembly including a double target, wherein each of the targets includes a cathode, both cathodes being supplied with power from an MF-generator in a manner such that each of the cathodes works in an alternating manner as anode and cathode. According to typical embodiments, the MF-generator provides power to the cathodes at frequencies in the range of 1 kHz to 100 kHz, such as 40 kHz.

Such a combination of substrate heating and sputtering at a medium frequency has the effect of providing a gate insulating layer with a particularly high film quality. Such a high film quality of the gate insulating layer allows fabrication of a TFT with improved properties with respect to at least some known TFTs.

In particular, at least some of the embodiments described herein allow fabrication of a TFT having a high breakdown voltage, such as, but not limited to, 9 MV/cm, and a low leakage current, such as, but not limited to, 1 nA/cm$^2$. These values of the breakdown voltage and leakage current represent a significant improvement in comparison to at least some known TFTs. In particular, at least some of the embodiments described herein allow fabrication of a TFT having values of the breakdown voltage and leakage current, which represent an improvement of a factor 10 to 100 relative to at least some known TFTs.

Furthermore, sputtering of a gate insulating material, such as silicon oxide, silicon oxynitride, or silicon nitride, in accordance to embodiments of the present invention facilitates a fabrication of a TFT, which avoids the use of toxic gases without impairing film quality of the gate insulating layer. In contrast thereto, at least some known methods for forming the gate insulating layer in applications where a high film quality is required, such as chemical vapor deposition (CVD), produce such toxic gases. Furthermore, sputtering of silicon oxide, silicon oxynitride, or silicon nitride in accordance to embodiments of the present invention facilitates a high-quality TFT fabrication, wherein all deposition steps are performed by large area sputter deposition. Thereby, a significant increase of efficiency in the fabrication process may be achieved.

In addition thereto, sputtering of silicon oxide, silicon oxynitride, or silicon nitride in accordance to at least some of the embodiments of the present invention allows a fabrication of a TFT, which avoids damage of the channel layer of the TFT when the gate insulating layer is deposited thereon without impairing film quality of the gate insulating layer. In contrast thereto, at least some known methods for forming the gate insulating layer, causes damages to the channel layer either through a plasma produced during deposition or by diffusion of hydrogen into the channel.

According to certain embodiments, the deposition method is for forming a gate insulating layer of a TFT having a semiconductor layer adjacent to the gate insulating layer (i.e., a channel), which semiconductor layer includes a sputtered metal oxide, such as, but not limited to indium gallium zinc oxide (IGZO). In such kinds of TFTs, the quality requirements for the gate insulating layer are particularly high. Therefore, deposition of a gate insulating layer according to embodiments herein is advantageous for these kinds of TFTs since, thereby, a particularly high film quality is facilitated.

The embodiments described herein include a deposition system for forming at least a portion of a TFT. FIG. 1 schematically illustrates an example of such a deposition system 180. In the exemplary embodiment, deposition system 180 includes a processing chamber 104 adapted to contain a processing gas 116. According to typical embodiments, processing chamber 104 is a high vacuum chamber. Processing gas 116 is for producing a plasma in processing chamber 104. Processing gas 116 may include at least one of argon, oxygen, or nitrogen. For example, processing gas 116 may include argon or, alternatively, argon and oxygen or, alternatively, argon and nitrogen or, alternatively, argon, oxygen, and nitrogen.

The exemplary embodiment further includes a heating system 112 for heating substrate 102 to a substrate processing temperature of between 50 and 350° C. The exemplary deposition system 180 further includes a sputtering system 128 which is configured for sputtering target material from a target assembly 108, so that a gate insulating material, such as silicon oxide silicon oxynitride, or silicon nitride may be deposited over substrate 102. Thereby, a gate insulating layer 100 may be formed over a substrate in order to fabricate a TFT. In the exemplary embodiment, target assembly 108 includes target elements 106a, 106b, which target elements contain target material, and cathodes 132a, 132b.

According to certain embodiments, silicon oxide is deposited over heated substrate 102 by sputtering a target assembly 108 at a medium frequency. Thereby, a gate insulating layer is formed by deposition of silicon oxide, in particular, $SiO_2$, a well characterized material, which facilitates a high control in the formation of the gate insulating layer.

According to certain embodiments, for implementing medium frequency sputtering, the sputtering system may include at least two electrodes, forming part of the target assembly, and a power supply, which power supply is operatively coupled to the electrodes in a manner such that a medium frequency AC power is coupled to the plasma during sputtering of the target material.

As shown in FIG. 1, the exemplary deposition system 180 further includes an AC power supply 130 coupled to cathodes 132a and 132b of sputtering system 128 through electrical connections 134a and 134b. AC power supply 130 supplies cathodes 132a and 132b with electrical power for maintaining a plasma within processing chamber 104 during sputtering.

According to typical embodiments, the operating power of the cathode may be 1 and 200 kW or, more particularly, between 5 and 100 kW. AC power supply 130 may be coupled to any suitably arranged electrode that enables deposition system 180 to sputter a target element at a medium frequency according to embodiments of the present disclosure.

Cathodes 132a and 132b are disposed relative to respective target elements 106a, 106b in a manner such that a gate insulating material, such as silicon oxide silicon oxynitride, or silicon nitride can be deposited over substrate 102 by sputtering of target material according to embodiments herein. In particular, targets elements 106a, 106b may be bonded to respective cathodes 132a, 132b. In alternative embodiments, target elements 106a, 106b are non-bonded to the respective cathodes. Sputtering system 128 (in particular AC power supply 130 and electrical connections 134a, 134b) is typically configured in a manner such that each of cathodes 132a, 132b works in an alternating manner as anode and cathode. Thereby, elimination of process instabilities is facilitated.

Cathodes 132a, 132 may be water-cooled and may further include an imbedded magnet assembly (not shown). Furthermore, sputtering system 128 may include an appropriate grounded shielding (not shown). The present disclosure contemplates different designs and, eventually, different magnet assembly configurations for addressing particular requirements of the deposition system according to embodiments herein.

In the exemplary embodiment, heating system 112 is configured for heating substrate 102 to a substrate processing temperature of between 50 and 350° C. According to certain embodiments, heating system may include a heater glass for heating of substrate 102. In addition thereto, sputtering system 128 is configured for depositing silicon oxide, silicon oxynitride, or silicon nitride over heated substrate 102 by medium frequency sputtering. According to typical embodiments, deposition system 180 is configured for performing the deposition of silicon oxide silicon oxynitride, or silicon nitride when the substrate is at a temperature between 50 and 350° C.

In the exemplary embodiment, deposition is performed by sputtering the target material at a medium frequency (e.g. a frequency between 1 and 100 kHz). That is, according to typical embodiments, a medium frequency power is generated by AC power supply 130 and transmitted to cathodes 132a and 132b for being coupled to a plasma within processing chamber 104 during sputtering. Thereby, the medium frequency power is fed to the plasma contained in chamber 116, so that sputtering of target elements 106a, 106b is continued. It should be noted that the sputtering power typically directly corresponds to the voltage applied to the target assembly. Apart from values close to 0V, the relation between applied voltage and sputtering power is typically linear in a first approximation. Therefore, a voltage varying over time applied to the target assembly generally results in a sputtering power varying over time.

According to certain embodiments, an anode (not shown in FIG. 1) to which a positive potential is applied, is positioned close to the target assembly. Such an anode may have the shape of a bar, with the bar's axis being typically arranged in parallel to the axis of the angular tube. In alternative embodiments, a separate bias voltage may be applied to the substrate. According to typical embodiments, a gate insulating layer is deposited onto the previously deposited/processed layer of the TFT (see example below).

According to typical embodiments, substrate 102 includes the layers of a TFT, which have been formed before deposition of gate insulating layer 100. For example, but not limited to, substrate 102 may include a transistor substrate (e.g., glass), a gate material (e.g., indium tin oxide (ITO)). As another example, substrate 102 may include a transistor substrate (e.g., glass), a conductive layer (e.g., an ITO layer) including source and drain contacts, and a channel layer (e.g., an IGZO layer).

Sputtering may be undertaken as diode sputtering or magnetron sputtering. In certain embodiments, magnetron sputtering is particularly advantageous in that the achieved deposition rates are high in comparison to diode sputtering. According to certain embodiments, the sputtering system includes a magnet assembly (such as, but not limited to, a magnet positioned within a rotatable target) for trapping free electrons within a generated magnetic field. According to typical embodiments, such a magnet assembly is arranged in a manner such that the magnetic field is generated directly adjacent to the target surface facing the substrate. Thereby, free electrons are forced to move within the magnetic field and cannot escape, so that the probability of ionizing gas molecules is increased, typically by several orders of magnitude, and, therefore, the deposition rate is significantly increased.

The term "magnet assembly" as used herein is a unit capable of a generating a magnetic field including at least one magnet. According to typical embodiments, the magnet assembly includes a plurality of magnets. The magnet assembly may include or consist of a permanent magnet. Such a permanent magnet may be arranged within a rotatable target in a manner such that free electrons are trapped within the generated magnetic field. According to typical embodiments, the sputtering system includes a rotatable sputter target. The rotatable target may have any appropriate geometry that enables the deposition system to function as described herein. According to typical embodiments, the rotatable target has a cylindrical geometry.

According to certain embodiments, the target assembly includes a rotatable target. In particular, the target assembly may include a double rotatable target, in particular, a double rotatable target configured for MF sputtering.

Figure 2:
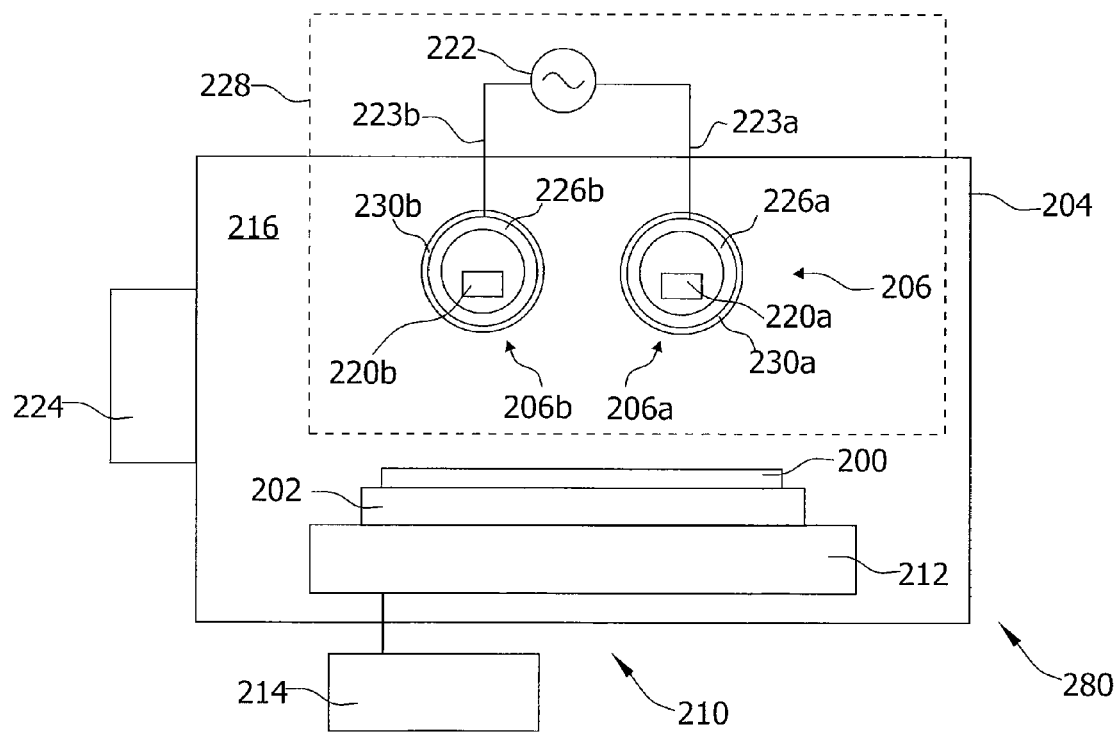
FIG. 2 is a schematic representation of another exemplary deposition system.

FIG. 2 schematically illustrates another example of a deposition system 280. In the exemplary embodiment, the sputtering system includes a target assembly 206 with two rotatable cylindrical target sub-assemblies 206a, 206b. In alternative embodiments, which may be combined with other embodiments disclosed herein, the sputtering system may include a target assembly with one, three, four or more targets, such as, but not limited to, those described in the exemplary embodiments. Examples of rotatable cylindrical target assemblies are described in U.S. patent application Ser. No. 12/577,073, entitled "Method for coating a substrate and coater" filed Oct. 9, 2009, which is incorporated herein by reference to the extent the application is not inconsistent with this disclosure.

In a typical embodiment, which may be combined with other embodiments disclosed herein, rotating cylindrical target sub-assemblies 206a, 206b are driven by a drive assembly (not shown). At least one of the rotating cylindrical target sub-assemblies 206a, 206b may include a backing tube 226a, 226b in which a magnet assembly 220a, 220b is disposed. Such a backing tube 226a, 226b may be formed of a suitable non-magnetic material, such as copper, brass, or stainless steel and is designed according to the requirements of the operation to be performed. Cylindrical target elements 230a, 230b containing the target material to be sputtered are disposed around a respective backing tube 226a, 226b.

The target elements may be bonded to a respective backing tube. Alternatively, the target elements may be disposed non-bonded to a backing tube. For example, a backing tube may include a tube adapted for one or more non-bonded target cylinders to be disposed around the tube. The tube may have an exterior surface adapted to face at least one of the target cylinders and at least three or more protrusion receiving positions. The tube may further include protrusions mounted on the exterior surface of the tube at each of the protrusion receiving positions for centering the target cylinders. Examples of such a backing tube are described in U.S. patent application Ser. No. 12/505,363, entitled "Target backing tube, cylindrical target, and cylindrical target assembly" filed Jul. 17, 2009, which is incorporated herein by reference to the extent the application is not inconsistent with this disclosure.

According to typical embodiments, magnet assemblies 220a, 220b have an elongated structure extending in parallel to the longitudinal extension of backing tubes 226a, 226b, in which the assemblies are disposed. For example, magnet assemblies 220a, 220b may be disposed parallel to the longitudinal or rotating axis of the backing tubes 226a, 226b. According to typical embodiments, magnet assemblies 220a, 220b have substantially the same length as their respective backing tubes. For example, the magnet arrangement may have a length of about 80% or more, for example 90% or more, of the longitudinal extension of a portion of the backing tube in processing chamber 204. The magnetic assemblies are arranged and oriented relative to one another in a manner such that the sputtered material is appropriately focused upon substrate 202. In a typical embodiment, a magnet assembly may include an array of three magnets. Examples of such a magnet assembly are described in U.S. patent application Ser. No. 12/641,080, entitled "Angle of magnetic field for rotary magnetrons" filed Dec. 17, 2009, which is incorporated herein by reference to the extent the application is not inconsistent with this disclosure.

A rotatable target facilitates a significantly high utilization of target material as compared to other targets, such as a planar target. That is, a higher quantity of the target material can be sputtered and relatively less unused material remains on the target when the deposition process is finished. Furthermore, a deposition system according to embodiments herein including a rotatable target facilitates a high utilization of target material without impairing film quality due to the combination of target geometry with appropriate sputtering parameters, namely, substrate processing temperature and sputtering frequency.

Deposition system 280 may further include an AC power supply 222 coupled to a cathode of target assembly 206. Thereby, a medium frequency power may be generated by AC power supply 222 and coupled to a plasma within processing chamber 204 during sputtering. In the exemplary embodiment, AC power supply 222 is coupled to backing tubes 226a, 226b through respective electrical connections 223a, 223b, which tubes function as cathodes for coupling electrical power to a plasma within processing chamber 104 during sputtering. Alternatively, AC power supply 222 may be coupled to any suitably arranged electrode that enables deposition system 280 to sputter target material at a medium frequency according to embodiments of the present disclosure.

According to certain embodiments, as illustrated in the exemplary embodiment of FIG. 2, deposition system 280 includes a heating system 210 having a heater 212 coupled to substrate 202 for heating thereof. Heating system 210 further includes a heating control system 214 associated with heater 212 to control a substrate processing temperature. Heating control system 214 is configured to adjust the substrate processing temperature to a temperature between 50 and 350° C. Thereby, substrate processing temperature during the formation of gate insulating layer 200 by medium frequency sputtering may be adjusted, so that a high quality film may be achieved, as discussed above.

According to typical embodiments, heating system 210 is configured to adjust the temperature of the transistor substrate (i.e., the substrate onto which at least a portion of a TFT is being formed). In alternative embodiments, heating system 210 is configured to adjust the temperature of the layer onto which the gate insulating layer is formed, such as, but not limited to, a gate insulating layer of the TFT.

According to typical embodiments, as illustrated in the exemplary embodiment of FIG. 2, deposition system 280 further includes a gas supply 224 associated with processing chamber 204 for supplying a processing gas 216 thereto. According to typical embodiments, gas supply 224 and target assembly 206 are configured to form a gate insulating layer 200 by reactive sputtering. In particular, according to certain embodiments, target assembly 206 includes a target material, which reacts with a reactive material in processing gas 216. For example, according to particular embodiments, the target material includes silicon and the processing gas includes at least one of oxygen or nitrogen, so that when silicon is sputtered, sputtered silicon reacts with at least one of oxygen or nitrogen in the processing gas, so that a film of silicon oxide, silicon oxynitride, or silicon nitride is deposited over the substrate, thereby forming a gate insulating layer.

According to certain embodiments, gas supply 224 and target assembly 206 are configured to form gate insulating layer 200 by full reactive sputtering. In particular, in these embodiments, the target material does not include the reactive material and, substantially, the completely deposited silicon oxide silicon oxynitride, or silicon nitride is originated from the reaction of sputtered silicon with at least one of oxygen or nitrogen in processing gas 216.

Embodiments of the present disclosure implementing reactive sputtering facilitate controlling the composition of the deposited silicon oxide, silicon oxynitride, or silicon nitride by varying the relative pressures of the inert and reactive gases. Thereby, at least some embodiments of the present disclosure enable a particularly high film quality for forming a gate insulating layer by combining a proper control of film composition with appropriate sputtering parameters, namely, substrate processing temperature and sputtering frequency.

Gas supply 224 may include a partial pressure control (not shown) for facilitating control of the partial pressure of components of processing gas 216. For example, gas supply 224 may include an arrangement of actuated valves controlled through a dynamic feedback control for precisely controlling the partial pressure of at least one component of the processing gas, such as, but not limited to, oxygen, nitrogen and/or argon. In addition thereto, deposition system 280 may include a pumping system (not shown) capable of achieving a pressure within processing chamber 204 sufficiently low for enabling the deposition system to be operable for a particular application, such as a pressure of $1 \times 10^{-7}$ mbar.

The pressure during deposition (i.e. deposition pressure) may be between 1 and 10 μbar. For particular embodiments, wherein the processing gas includes argon and at least one of oxygen or nitrogen, the argon partial pressure may be between 1 and 4 μbar, and the oxygen and/or nitrogen partial pressure may be between 1 and 8 μbar. These pressure values are not limiting, and pressure for deposition may have any suitable values which enable formation of a gate insulating layer according to embodiments herein.

Although the exemplary embodiments of FIGS. 1 and 2 illustrate a target assembly arranged above a horizontally arranged substrate and the definition of the substrate-target interconnection plane was illustratively explained with respect to those embodiments, it shall be mentioned that the orientation of the substrate in space can also be vertical. In particular, in view of large-area coating, a vertical orientation of the substrate may simplify and ease transportation and handling of a vertically oriented substrate. In other embodiments, the substrate is arranged somewhere between a horizontal and a vertical orientation.

It is noted that a deposition system according to embodiments of the present disclosure may include any suitable structure, configuration, arrangement, and/or components required for a particular application thereof.

Figure 3:
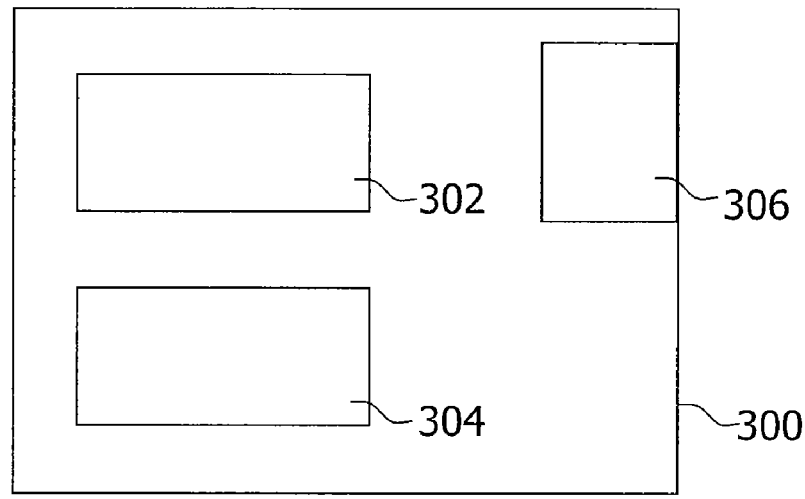
FIG. 3 is a block diagram illustrating an exemplary control assembly for use with a deposition system according to embodiments herein.

FIG. 3 illustrates a block diagram of an exemplary control assembly 300 for use with a deposition system. The exemplary control assembly 300 may be used to control the exemplary deposition systems of FIGS. 1 and 2 to form at least a portion of a TFT onto a transistor substrate. As discussed above, the exemplary deposition systems include a heating system for heating a transistor substrate and a sputtering system for depositing silicon oxide, silicon oxynitride, or silicon nitride by sputtering a target assembly at a sputtering frequency.

The exemplary control assembly 300 includes a heating control module 302 configured to operate a heating system for adjusting the temperature of a transistor substrate to a substrate processing temperature. The exemplary control assembly 300 further includes a sputtering control module 304 configured to operate a sputtering system for forming a gate insulating layer of a TFT by sputtering a target at a sputtering frequency in the medium frequency range when the substrate processing temperature is approximately between 50 and 350° C.

According to typical embodiments, control assembly 300 may further include an input/output interface 306 for facilitating communication with a deposition system, such as the deposition systems described above. For example, input/output interface 306 may enable heating control module 302 to receive signals relating to a substrate processing temperature and to send control signals for adjusting the substrate processing temperature.

The exemplary control assembly 300 typically includes a real-time controller (not shown) for real-time control of sputtering parameters, such as, but not limited to, substrate temperature and sputtering power, voltage, or current. According to embodiments of the present disclosure, such a real-time controller may include any suitable processor-based or microprocessor-based system, for example a computer system, which includes, among others, microcontrollers, application-specific integrated circuits (ASICs), reduced instruction set circuits (RISC), logic circuits, and/or further thereto, any other circuit or processor that is capable of executing the functions described herein. In certain embodiments, controller 102 is a microprocessor including read-only memory (ROM) and/or random access memory (RAM), such as, e.g., a 32-bit microcomputer with a 2-Mbit ROM, and a 64 Kbit RAM. The term "real-time" refers to outcomes taking place in a substantially short period of time after a change in the inputs affect the outcome, with the time period being a design parameter that may be selected based on the importance of the outcome and/or the capability of the system processing the inputs to generate the outcome.

According to typical embodiments, heating control module 302 implements a heating control loop, such as a PID-controller for adjusting a substrate processing temperature to a predetermined temperature, such as a temperature between 50 and 350° C. Sputtering control module 304 may implement a sputtering control loop for controlling a sputtering system of the deposition system for depositing silicon oxide, silicon oxynitride, or silicon nitride over a substrate when the substrate is at a predetermined temperature. According to typical embodiments, such a sputtering control loop is configured for appropriately controlling sputtering parameters such as, but not limited to, sputtering power, voltage, or current.

According to typical embodiments, control assembly 300 may implement a control loop for controlling a whole TFT fabrication process. For example, control assembly 300 may operate a conveyor system for transporting a substrate into the processing chamber system. Further thereto, control assembly 300 may operate the deposition system for ensuring that the atmosphere within the processing chamber is appropriate for performing sputtering, for example by operating vacuum pumps for evacuating air from the processing chamber. Further thereto, control assembly 300 may operate a gas supply system for feeding a certain amount of a first component gas, such as argon, within the processing chamber. Further thereto, control assembly 300 may operate a gas supply system for feeding a certain amount of a second and/or a third component gas, such as oxygen and/or nitrogen, within the processing chamber. Further thereto, control assembly 300 may operate a cooling system for cooling a magnet assembly included in a target. Further thereto, control assembly 300 may operate a target assembly such as, but not limited to, a target assembly including two rotatable targets, for rotation thereof during sputtering. Further thereto, control assembly 300 may operate an AC power supply operatively connected to a processing chamber for maintaining a plasma within the chamber during sputtering of a target assembly through the plasma. Thereby, a target material may be sputtered by sputtering and a gate insulating layer may be formed over a substrate by deposition of a gate insulating material, such as silicon oxide, silicon oxynitride, or silicon nitride, eventually through full reactive sputtering.

Figure 4:
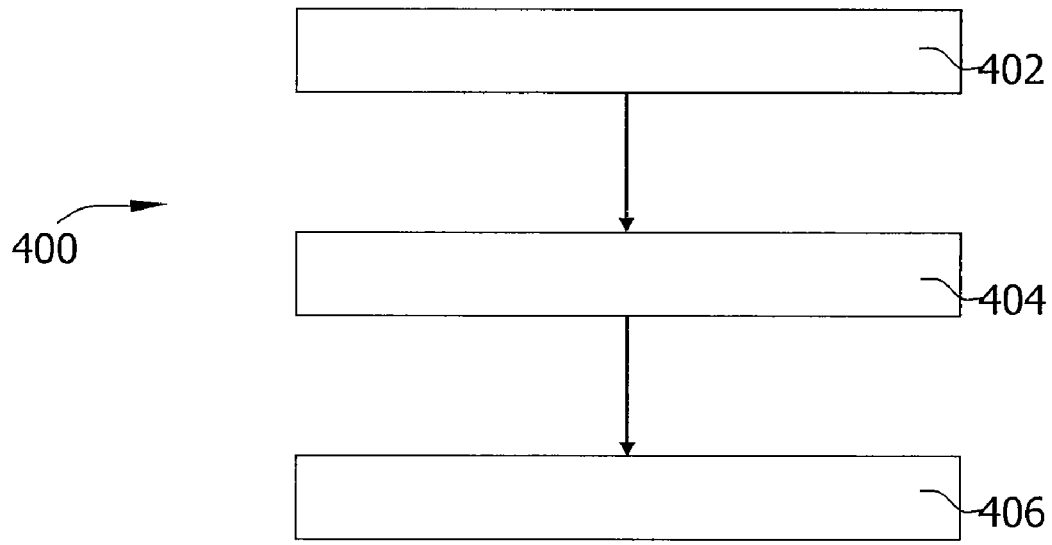
FIG. 4 is a flow chart illustrating an exemplary deposition method.

FIG. 4 is a flow chart illustrating an exemplary deposition method 400 for forming a TFT gate insulating layer over a substrate. Such a deposition method 400 may be used to operate exemplary deposition systems 180, 280 and/or control assembly 300 of FIGS. 1 to 3.

Exemplary deposition method 400 includes introducing 402 a processing gas for producing a plasma in a processing chamber in which a substrate is disposed. According to typical embodiments, the processing gas is introduced by operating a gas supply system associated to the processing chamber, as described above.

Exemplary deposition method 400 further includes heating 404 the substrate to a substrate processing temperature of between 50 and 350° C. According to typical embodiments, heating 404 is performed by operating a heating system for heating the substrate to a substrate processing temperature of between 50 and 350° C. According to particular embodiments, heating 404 is performed by operating a heating control system, which is configured to adjust the substrate processing temperature to a temperature between 50 and 350° C. Such a heating control system is, in typical embodiments, associated with a heater coupled to the substrate, so that the substrate processing temperature can be controlled, as described above.

Exemplary deposition method 400 further includes depositing 406 silicon oxide, silicon oxynitride, or silicon nitride over the heated substrate by sputtering a target at a medium frequency. According to typical embodiments, heating 404 is performed before and during depositing 406, so that silicon oxide, silicon oxynitride, or silicon nitride is deposited over a substrate, which is at a substrate processing temperature between 50 and 350° C. According to typical embodiments, depositing is performed at a frequency of between 1 and 100 kHz. In typical embodiments, this magnet assembly forms part of a target, as detailed above. According to certain embodiments, sputtering is performed using a processing gas, which at least includes argon and/or at least one of oxygen or nitrogen, as detailed above.

According to certain embodiments, sputtering 406 may be full reactive sputtering. By full reactive sputtering is meant a process including sputtering a target that does not contain the reactive material in an atmosphere containing the reactive material. For example, full reactive sputtering may include sputtering a pure silicon target (e.g., a target containing highly pure silicon, such as silicon with a purity degree of 4N) in a chamber containing at least one of oxygen and/or nitrogen for deposition of silicon oxide, silicon oxynitride, or silicon nitride over a substrate. By implementing full reactive sputtering, an appropriate control of the deposition parameters and the layer thickness is facilitated. Such appropriate control provided by full reactive sputtering combined with substrate heating and sputtering at medium frequency further facilitates achieving a high film quality of the formed gate-insulating layer.

In other alternative embodiments, sputtering may be direct sputtering. By direct sputtering is meant a process including sputtering a target containing the material to be deposited in reacted form. For example, sputtering may include sputtering a target including silicon oxide, silicon oxynitride, or silicon nitride for deposition of silicon oxide over a substrate. Direct sputtering may facilitate a less complex construction of a deposition system for performing deposition method 400, since a reactive component gas is then no longer required. Furthermore, embodiments of the present disclosure implementing these sputtering methods do not compromise film quality of the formed gate insulating layer in view of the combination of substrate heating and sputtering at medium frequency.

According to certain embodiments, the target assembly includes a pure silicon target, that is, a target in which the target material is high-purity silicon. For example, but not limited to, the target may include or substantially consists of silicon with a purity degree of at least 2N (i.e., silicon with 99% purity), or of at least 3N (i.e., silicon with 99.9% purity), or even of at least 4N (i.e., silicon with 99.99% purity), or more. Furthermore, according to certain embodiments, the target assembly includes pure silicon with a purity degree of at least 4N. A high degree of silicon purity facilitates an appropriate control of the stoichiometry of the deposited silicon oxide, silicon oxynitride, or silicon nitride. Such appropriate stoichiometry control combined with substrate heating and sputtering at medium frequency further facilitates achieving a high film quality of the formed gate insulating layer.

According to certain embodiments, the target assembly includes a silicon target with reduced iron content. In particular, the target assembly may include a silicon-containing sputter material, wherein the sputter material contains less than 200 ppm (i.e., parts per million) iron. Examples of a target with a reduced iron content are described in U.S. patent application Ser. No. 12/388,342, entitled "Sprayed Si- or Si:Al-Target with low iron content" filed Feb. 18, 2009, published under Pub. No. US20090218213, which is incorporated herein by reference to the extent the application is not inconsistent with this disclosure.

According to certain embodiments, the target assembly contains aluminum (Al). In particular, target material in the target assembly may have an Al content of at least 0.5% or, more specifically, 1%. Furthermore, the target may have an Al content of less than 3% or, more specifically, less than 2%. According to certain embodiments, the target assembly may have an Al content as above and, in addition thereto, an iron content of less than 200 ppm.

Figure 5:
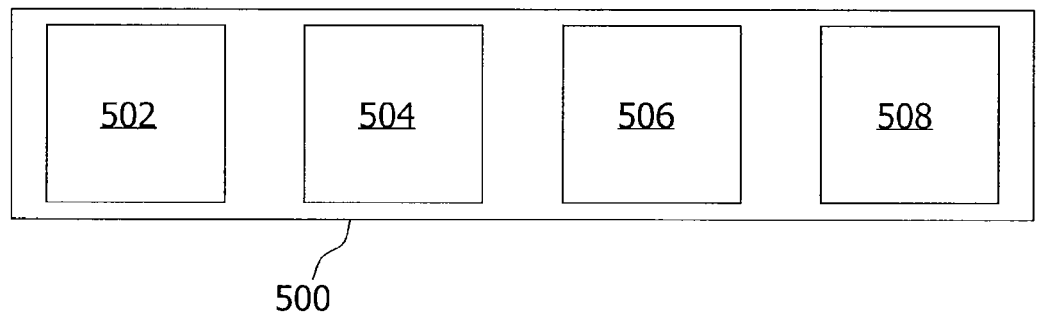
FIG. 5 is a schematic representation of yet another exemplary deposition system.

Embodiments of the present disclosure further include a deposition system including multiple modules. According to typical embodiments, each of the multiple modules implements deposition of at least one layer of a TFT. FIG. 5 illustrates another exemplary deposition system 500 for forming at least a portion of a TFT. Deposition system 500 includes a gate insulating layer module 502 (hereinafter referred to as GIL-module 502). GIL-module 502 is for depositing a gate insulating layer and may be implemented as a deposition system according to embodiments of the present disclosure.

According to certain embodiments, deposition module 500 may further include a channel deposition module 504 configured to form a semiconductor layer configured to be adjacent to a gate insulating layer. Typically, such a semiconductor layer is configured for being operated as a channel of a TFT. According to typical embodiments, channel deposition module 504 is configured to form the semiconductor layer by sputtering. Furthermore, channel deposition module 504 may be configured to form the semiconductor layer in a manner such that the semiconductor layer includes a metal oxide such as, but not limited to, indium gallium zinc oxide (IGZO), zinc oxide (e.g., ZnO), ZnSnO, or IZO. For example, the semiconductor layer may be formed as a metal oxide film deposited adjacent to a gate insulating layer. Combining sputtering of a semiconductor layer, such as a metal oxide film, with the method for forming a gate insulating layer according to embodiments of the present disclosure facilitates large area manufacturing of TFTs over a substrate with a high production rate without compromising performance of the manufactured TFTs.

Channel deposition module 504 may include any suitable configuration, which enables deposition of a semiconductor layer as described above, in particular, a semiconductor layer configured for being operated as a channel of a TFT. For example, channel deposition module 504 may include a ceramic target for direct sputtering of IGZO. Alternatively, channel deposition module may be constituted as a full reactive sputtering system configured to deposit IGZO.

According to certain embodiments, deposition module 500 may further include an etch stop layer deposition module 506 (hereinafter referred to as ESL-module 506) configured to form an etch stop layer configured to be adjacent to a semiconductor layer of the TFT, i.e., the active layer, or channel, of the TFT. According to typical embodiments, ESL-module 506 is configured to form the etch stop layer by sputtering. Furthermore, the ESL-module 506 may be configured to form the etch stop layer in a manner such that the etch stop layer includes a silicon oxide (e.g., SiO or $SiO_y$). For example the etch stop layer may be formed as a $SiO_2$ layer, formed adjacent to the active layer of the TFT. ESL-module 506 may include any suitable configuration which enables deposition of an etch stop layer for a TFT. For example, ESL-module 506 may be constituted as a full reactive sputtering system configured to deposit $SiO_2$.

Alternatively, deposition module 500 may be configured for performing a back-channel-etch (BCE) process for forming at least a portion of a TFT. Thereby, formation of an etch stop layer, and ESL-module 506, may be omitted. According to certain embodiments, deposition module 500 is configured for depositing at least a portion of a TFT having a coplanar structure.

According to typical embodiments, deposition module further includes a patterning module (not shown) for patterning of the semiconductor layer deposited by channel deposition module 504.

According to certain embodiments, deposition module 500 may further include a passivation layer deposition module 508 (hereinafter referred to as PL-module 508) configured to form a passivation layer of the TFT. According to typical embodiments, PL-module 508 is configured to form the passivation layer by sputtering. Furthermore, the PL-module 508 may be configured to form the passivation layer in a manner such that the passivation layer includes a silicon oxide (e.g., SiO or $SiO_y$). For example, the passivation layer may be formed as a $SiO_2$ layer.

PL-module 508 may include any suitable configuration which enables deposition of a passivation layer for a TFT. For example, PL-module 508 may be constituted as a full reactive sputtering system configured to deposit $SiO_2$.

A modular design of a deposit system according to embodiments of the present disclosure facilitate a reduction of costs, a significantly faster cycle time and a flexible configuration of deposition system 500 which maximizes production efficiency. Furthermore, a deposition system configured to form a gate insulating layer or, for example, a gate insulating layer and at least one of an etch stop layer or a passivation layer according to embodiments herein facilitates a fabrication of a TFT which avoids the use of toxic gases without impairing film quality of the gate insulating layer, in contrast to, for example, deposition systems based on CVD methods.

According to typical embodiments, the above described modules are configured to form the different layers over a common substrate in order to form a TFT. Such a substrate may be transported between the different modules by a suitable conveyor system. Alternatively, the substrate may be formed as a flexible band, which is transported between the different modules by a roll-to-roll band transportation system.

A deposition system according to embodiments herein may be combined with one or more modules for further processing of the substrate in order to manufacture a TFT, such as, for the formation of a gate, a source and/or a drain contact. Furthermore, at least some or all of the deposition steps described below may be performed in the same module. It is to be understood that other methods may be utilized to deposit the semiconductor layer, a passivation layer, and/or, eventually, an etch stop layer, such as, but not limited to, atomic layer deposition or spin-on processes.

Figure 6:
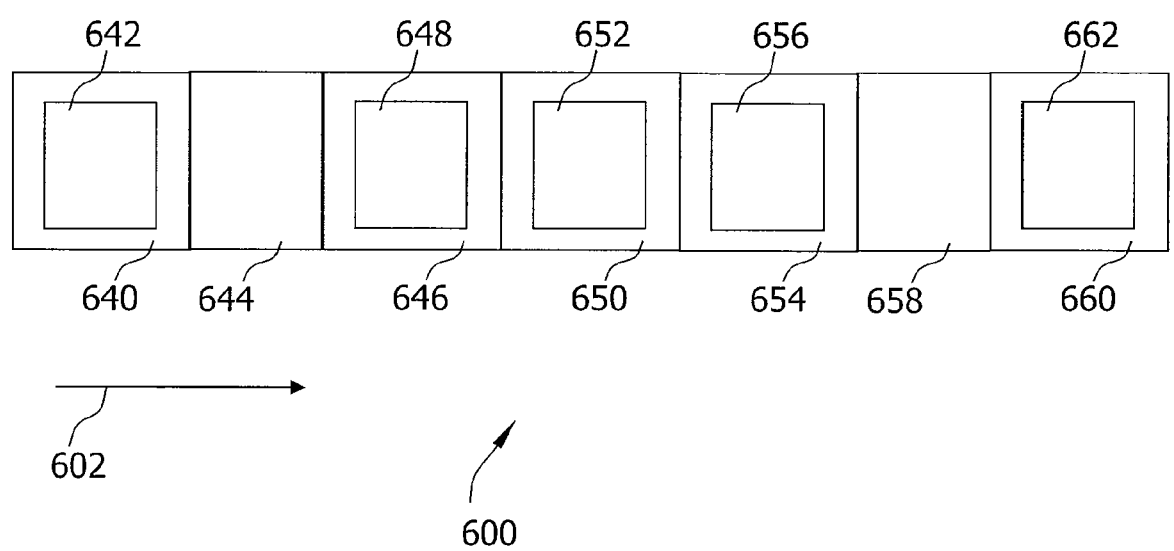
FIG. 6 is a schematic representation of an exemplary system for fabricating a TFT.
Figure 7:
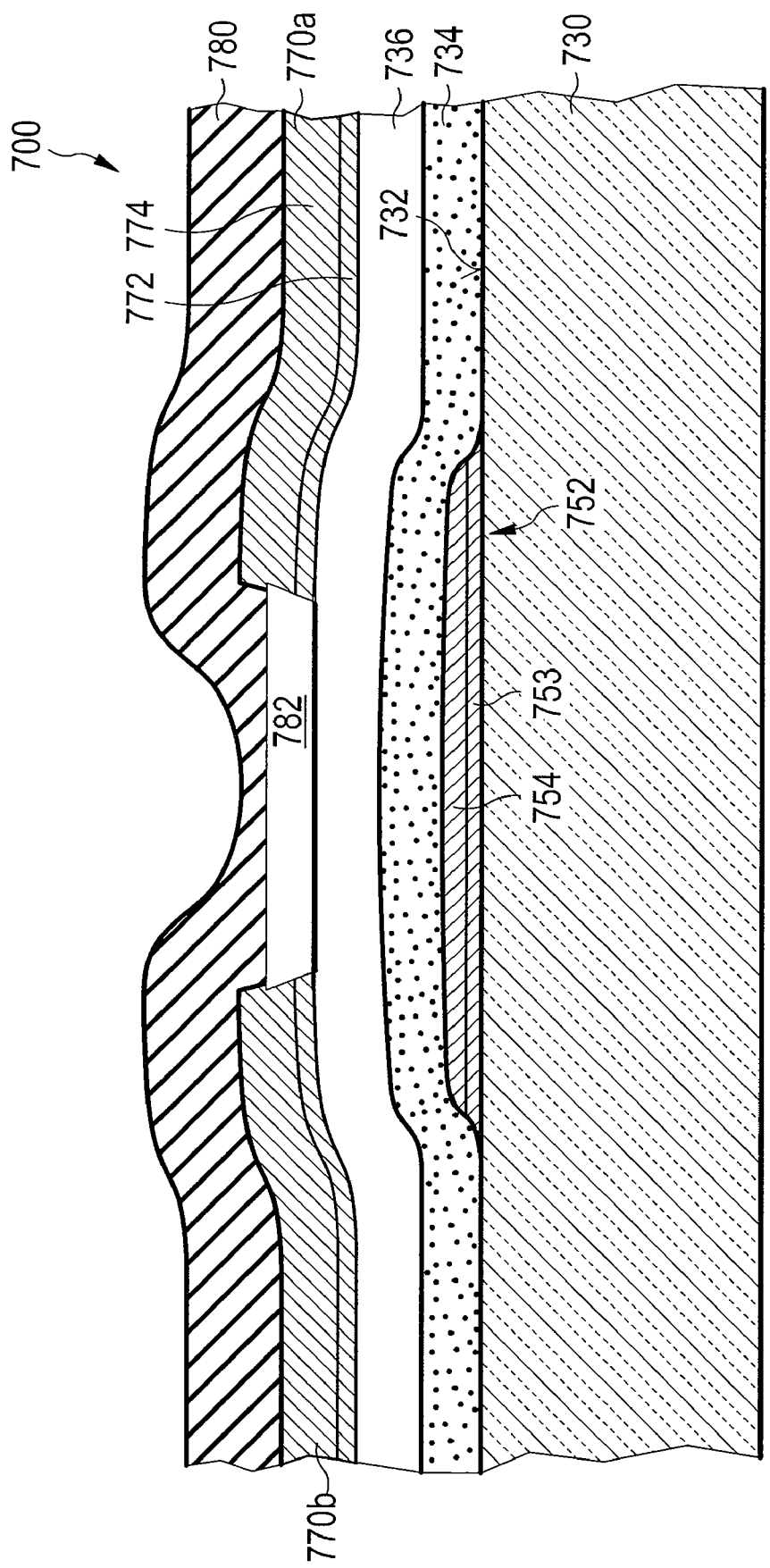
FIG. 7 is a schematic representation of a TFT fabricated according to embodiments herein.

FIG. 7 shows a schematic representation of a TFT 700 fabricated according to embodiments herein. According to embodiments of the present disclosure, TFT 700 is fabricated in a modular manufacturing system, such as the exemplary modular manufacturing system 600 of FIG. 6. Such a system may include one of the exemplary deposition systems for forming a thin-film transistor gate insulating layer shown in FIG. 1 or 2 or any of the modules shown in FIG. 5.

For fabrication of TFT 700 in manufacturing system 600, a transparent substrate 730 (e.g., a glass substrate) may be provided on a movable substrate support (not shown) for transporting transparent substrate 730 along a transport direction 602 into a first deposition chamber 640 of manufacturing system 600. Therein, a gate layer 752 may be deposited on an upper surface 732 of glass substrate 730. Deposition of gate layer 752 may be performed by sputtering, e.g. using a sputtering system 642 disposed in deposition chamber 640. Gate layer 752 may include or substantially consists of a metal such as, but not limited to, copper, gold, or titanium, or a conductive transparent material such as, but not limited to, ITO. Gate layer 752 may include or consist of a barrier/adhesion layer 753 and a conductive layer 754.

After gate layer 752 is deposited on transparent substrate 730, the processed substrate may be introduced into a first patterning chamber 644 of modular manufacturing system 600 for patterning of gate layer 752. Thereby, the gate 752 of TFT 700 may be formed. Here, "patterned" refers to shaping a deposited layer of material to have a desired form and dimensions, using, for example, selective etching techniques. Optionally, selective etching may be performed in another chamber of modular manufacturing system 600.

As a further step, the processed substrate may be introduced into a second deposition chamber 646 of modular manufacturing system 600 for forming a gate insulating layer 734 according to embodiments of the present disclosure. Second deposition chamber 646 may include a sputtering system 648 for forming gate insulating layer 734 by sputtering of a target. In particular, a gate insulating layer 734 may be deposited over gate 752 and the exposed portions of upper substrate surface 732 according to embodiments of the present disclosure. Gate insulating layer 734 may include or substantially consist of silicon oxide (e.g., SiO or $SiO_y$, such as $SiO_2$), silicon oxynitride (e.g., SiON), or silicon nitride (e.g., SiN) and may be deposited to a thickness between about 20 nm and 300 nm.

As a further step, the processed substrate may be introduced into a third deposition chamber 650 of modular manufacturing system 600, which chamber may be constituted as channel deposition module 504 described above. Then, a semiconductor layer 736 may be deposited over gate insulating layer 734. According to typical embodiments of the present disclosure, semiconductor layer 736 may include or substantially consists of a semiconductor material, such as, but not limited to, IGZO or doped silicon and may be deposited to a thickness of between about 20 nm and 300 nm. Semiconductor layer 736 is deposited in a manner such that this layer constitutes the channel of TFT 700. Deposition of semiconductor layer 732 may be performed by sputtering, e.g. by using a sputtering system 652 disposed in deposition chamber 650.

According to some embodiments, as a further step, the processed substrate may be introduced into a further deposition chamber (not shown) of modular manufacturing system 600 for forming an etch stop layer 782 over semiconductor layer 736. Etch stop layer 782 may include or substantially consist of silicon oxide (e.g., SiO or $SiO_y$, such as $SiO_2$). This further deposition chamber may be constituted as etch stop layer deposition module 506 described above. After deposition, etch stop layer 782 may be patterned, for example, in a further patterning module (not shown) or in first patterning module 644. Patterning is then performed in a manner such that a portion of etch stop layer 782 remains over semiconductor layer 736. Thereby, during a subsequent etching of a source/drain layer for forming a source and drain contact of TFT 700, semiconductor layer 736 is not exposed to a plasma. Such an exposure of semiconductor layer 736 may affect the performance of TFT 700.

Alternatively, modular manufacturing system 600 may be configured for manufacturing of a TFT without deposition of etch stop layer 782. For example, modular manufacturing system 600 may be configured for performing a back-channel-etch (BCE) process in order to form TFT 700. Thereby, formation of etch stop layer 782 may be omitted. According to certain embodiments, modular manufacturing system 600 is configured for depositing at least a portion of a TFT having a coplanar structure.

As a further step, the processed substrate including layers 752, 734, and 736 may be introduced into a fourth deposition chamber 654 of modular manufacturing system 600 for forming the source and drain contacts of TFT 700. Alternatively, the processed substrate may be reintroduced into first deposition chamber 640 for forming source and drain of TFT 700. In this manufacturing step, a source/drain layer 770 for forming the source and the drain of TFT 700 is deposited over semiconductor layer 736. Source/drain layer 770 may include a barrier/adhesion layer 772 and a conductive layer 774. To this end, a sputtering system 656 of chamber 654 or, alternatively, sputtering system 642 of chamber 640 is used. Source/drain layer 770 may include a metal such as, but not limited to, copper, gold, or titanium, or a conductive transparent material such as, but not limited to, ITO.

As a further step, the processed substrate may be introduced into a second patterning chamber 658 of modular manufacturing system 600 for patterning of source/drain layer 770. Thereby, a source electrode 770a and a drain electrode 770b may be formed. It is noted that the orientation of the source and the drain electrode shown in FIG. 7 is arbitrary; dependent on device arrangement, either electrode can serve as the source or the drain. Patterning of source and drain electrodes 770a, 770b may include removing a portion of source/drain layer 770 and of underlying semiconductor layer 736. This removal is performed near to gate 752, so that semiconductor layer 736 remains between the respective source and drain electrodes.

As a further step, the processed substrate may be introduced into a fourth deposition chamber 660 of modular manufacturing system 600, which chamber may be constituted as passivation layer deposition module 508 described above. Then, a passivation dielectric layer 780 may be deposited over the completed TFT 700 to, for example, a thickness of between about 100 nm and 1000 nm. Deposition of layer 752 may be performed by sputtering of silicon oxide (e.g., SiO or $SiO_y$, such as $SiO_2$), e.g. by using a sputtering system 662 disposed in deposition chamber 660.

It is noted that modular manufacturing system 600 may be arranged in a manner such that some of the deposition steps described above are performed in the same deposition chamber. Furthermore, modular manufacturing system 600 may be arranged in a manner such that all the deposition steps described above are performed in the same deposition chamber. Modular manufacturing system 600 may be constituted as a modular vertical inline system including a load lock module, a transfer module, a process modules (such as those described above), a rotation module, a cassette module, and/or an atmospheric handling unit. Furthermore, modular manufacturing system 600 may include a substrate carrier, an integrated robot for substrate loading and unloading, and a computer workstation for operational control of the system. For example, modular manufacturing system 600 may consist of an AKT-New Aristo 1800 (Applied Materials, Santa Clara) configured to function as described herein.

The written description uses examples to disclose the invention, including the best mode, and also to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the examples of embodiments and embodiments or modifications thereof described above may be combined with each other. In particular, the present disclosure contemplates a TFT manufactured according to embodiments herein. Moreover, the present disclosure contemplates a deposition system and a control assembly configured to form a TFT manufactured according to embodiments herein. Further, the patentable scope of the invention is defined by the claims, and may include other examples that occur to those skilled in the art. Such other examples are intended to be within the scope of the claims.

While the foregoing is directed to embodiments of the invention, other and further embodiments of the invention may be devised without departing from the basic scope thereof, and the scope thereof is determined by the claims that follow.

What is claimed is:

1. A method for forming a thin-film transistor gate insulating layer over a substrate disposed in a processing chamber, the method comprising:
   introducing a processing gas for producing a plasma in said processing chamber;
   heating said substrate to a substrate processing temperature of between 50 and 350° C.; and
   depositing silicon oxide, silicon oxynitride, or silicon nitride over the heated substrate by sputtering a target assembly at a medium frequency.

2. The method according to claim 1, wherein the deposition of silicon oxide, silicon oxynitride, or silicon nitride is performed at a frequency of between 1 and 100 kHz.

3. The method according to claim 1, wherein, depositing includes MF sputtering from a double cathode.

4. The method according to claim 1 further comprising forming by sputtering a semiconductor layer configured to be adjacent to the gate insulating layer, said semiconductor layer comprising a metal oxide.

5. The method according to claim 1 further comprising forming by sputtering an etch stop layer including silicon oxide and configured to be adjacent to a semiconductor layer of said thin-film transistor.

6. The method according to claim 3, wherein said target assembly includes a rotatable target.

7. The method according to claim 6, wherein the sputtering is a full reactive sputtering.

8. The method according to claim 6, wherein said target assembly includes a pure silicon target.

9. The method according to claim 6, wherein said target assembly includes a silicon-containing sputter material, wherein the sputter material contains less than 200 ppm iron.

10. The method according to claim 6, wherein said processing gas includes at least one of oxygen, argon, or nitrogen.

11. A deposition system for forming at least a portion of a thin-film transistor over a substrate, the deposition system comprising:
   a processing chamber adapted to contain a processing gas for producing a plasma in said processing chamber;
   a heating system being configured for heating the substrate to a substrate processing temperature of between 50 and 350° C.; and
   a sputtering system configured for depositing silicon oxide, silicon oxynitride, or silicon nitride over the heated substrate by sputtering a target assembly at a medium frequency in a manner such that a gate insulating layer is formed over the substrate.

12. The deposition system according to claim 11, wherein said heating system comprises a heater coupled to said substrate for heating thereof, and a heating control system associated with the heater to control said substrate processing temperature, the heating control system being configured to adjust said substrate processing temperature to a temperature between 50 and 350° C.

13. The deposition system according to claim 12, wherein said sputtering system includes an electrode and a power supply, said power supply being operatively coupled to said cathode in a manner such that a medium frequency AC power is coupled to the plasma during sputtering of said target assembly.

14. The deposition system according to claim 13, wherein said sputtering system includes a double cathode for the deposition of silicon oxide, silicon oxynitride, or silicon nitride over the heated substrate by sputtering the target assembly at the medium frequency.

15. The deposition system according to claim 14, wherein said target assembly includes a rotatable target.

16. The deposition system according to claim 15 further comprising a gas supply associated with said processing chamber for supplying said processing gas thereto, said gas supply and said target assembly being configured to form the gate insulating layer by full reactive sputtering.

17. The deposition system according to claim 16 further comprising a channel deposition module configured to form by sputtering a semiconductor layer configured to be adjacent to the gate insulating layer, said semiconductor layer comprising a metal oxide.

18. The deposition system according to claim 17 further comprising an etch stop layer deposition module configured to form by sputtering an etch stop layer including silicon oxide and configured to be adjacent to a semiconductor layer of said thin-film transistor.

19. The deposition system according to claim 18 further comprising a passivation layer deposition module configured to form by sputtering a passivation layer of said thin-film transistor, said passivation layer including silicon oxide.

20. A control assembly for use with a deposition system configured to form at least a portion of a thin-film transistor onto a transistor substrate, said deposition system comprising a heating system for heating the transistor substrate and a sputtering system for depositing silicon oxide, silicon oxynitride, or silicon nitride by sputtering a target assembly at a sputtering frequency, the control assembly comprising:

a heating control module configured to operate said heating system for adjusting the temperature of said transistor substrate to a substrate processing temperature; and a sputtering control module configured to operate said sputtering system for forming a gate insulating layer of the thin-film transistor by sputtering said target at a sputtering frequency in the medium frequency range when the substrate processing temperature is approximately between 50 and 350° C.

* * * * *